ARRANGEMENTS OF ONE-TRANSISTOR BISTABLE CIRCUITS

Filed March 17, 1965

INVENTOR
BRUCE E. BRILEY
BY C. A. Gulbrandsen
ATTY.

3,348,066
Patented Oct. 17, 1967

3,348,066

ARRANGEMENTS OF ONE-TRANSISTOR BISTABLE CIRCUITS

Bruce E. Briley, La Grange Park, Ill., assignor to Automatic Electric Laboratories, Inc., Northlake, Ill., a corporation of Delaware Filed Mar. 17, 1965, Ser. No. 440,370
4 Claims. (Cl. 307—88.5)

ABSTRACT OF THE DISCLOSURE

A bistable flip-flop circuit including a single grounded emitter transistor having minority storage capabilities. Normally the transistor is D.C. biased at its base and collector to a first stable or cutoff state. In the cutoff state, the collector-base junction of the transistor presents a high resistance to sinusoidal signals emanting from an A.C. source connected to the collector of the transistor, effectively blocking these signals from the base of the transistor. A momentary control pulse applied to the transistor effects the saturation thereof, causing the collector-base junction to present a low resistance to the A.C. source so that the sinusoidal signals are effectively coupled to the transistor base to keep the transistor in its second stable or saturated state. Upon the application to the transistor of a second momentary pulse, it returns to its first stable or cutoff state. A bistable flip-flop of this type may be used in a stage of a double rank shift register arrangement.

This invention relates in general to bistable circuits and in particular to flip-flop circuits which employ a single transistor and to shift registers which employ flip-flop circuits.

A copending application of this invention, Ser. No. 351,999, filed Mar. 16, 1964, discloses a flip-flop which employs a diode switch to control the input of a sinusoidal signal to the base of a single transistor employed in a common emitter configuration. The voltage on the collector of the transistor controls the operation of the switch by affecting the bias on the diodes. Thus, when the transistor is in its cutoff state, a positive voltage on the collector biases the diodes in the high resistance direction to block the sinusoidal signals from the base. When the transistor is placed in its saturated state by the input to its base of a pulse from an external source, the voltage on the collector drops, and the diodes are biased in the low resistance direction to couple the sinusoidal signals to the base of the transistor. The sinusoidal signals then maintain the transistor in a saturated state until another pulse from an external source places the transistor back in the cutoff state.

The collector-base junction of a junction type transistor (current gain alpha less than unity) with a grounded emitter is itself capable of performing the function of a diode. When biased in the high resistance direction, the collector-base junction will block signals coupled to the collector from reaching the base; when biased in the low resistance direction, the collector-base junction will couple signals from the collector to the base.

Therefore, it is an object of this invention to provide a simplified one-transistor flip-flop which utilizes the transistor itself as a switching element.

It is a further object of this invention to provide a shift register arrangement which employs one-transistor flip-flops in a double register configuration.

Other objects and a more complete understanding of this invention will be obtained by reading the following description in conjunction with the drawings in which.

Figure 1:
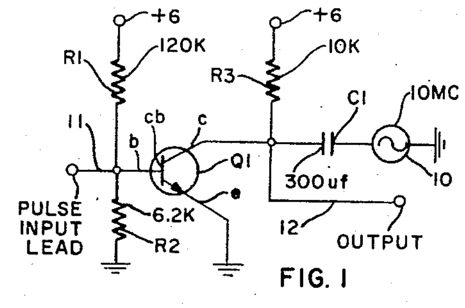
FIG. 1 is a schematic diagram of the one-transistor flip-flop of this invention.

With reference to FIG. 1, the flip-flop arrangement shown employs a single NPN transistor Q1 with a grounded emitter *e*, a base *b*, a collector *c*, and a collector-base junction *cb*. Resistors R1 and R2 are connected to the base *b* in a voltage divider arrangement. Pulse input lead 11 is also connected to the base *b* of the transistor Q1 at the junction of resistors R1 and R2. Resistor R3 connects the collector *c* of the transistor Q1 to the voltage supply; and sinusoidal signal source 10 is connected to the junction of the collector *c* and resistor R3 through capacitor C1. The output of the flip-flop is taken directly from the collector by output lead 12. A description of the operation of the flip-flop follows.

In the absence of a signal on the pulse input lead 11, the voltage divider formed by resistor R1 and R2 biases transistor Q1 to cutoff. In the cutoff state, the collector-base junction *cb* is biased in the high resistance direction so that the sinusoidal signals from source 10 are effectively decoupled from the base *b*. The collector *c* thus remains at an average potential equal to the supply voltage — — +6 volts in this case. This constitutes one stable state of the flip-flop.

The input of a positive voltage pulse of sufficient magnitude on lead 11 will cause transistor Q1 to saturate. With the transistor Q1 in a saturated state, the collector-base junction is biased in the low resistance direction, and the sinusoidal signals from source 10 are effectively coupled to the base *b*. When coupled to the base *b*, the sinusoidal signals affect the emitter current. If the amplitude and frequency of the sinusoidal signals are properly chosen, the signals will maintain transistor Q1 in a saturated state with an average potential near ground on the collector, *c*, even after the input pulse has ceased. This constitutes the second stable state of the flip-flop. When the flip-flop is in the second state, the input of the negative voltage pulse of sufficient magnitude on lead 11 will cause transistor Q1 to assume its cutoff state, and the cutoff state will persist until another positive pulse is applied. The attainment of the second stable state of the flip-flop depends upon the effective utiliaztion of the minority carrier storage and collector following phenomena. The application of these phenomena to the flip-flop of this invention will now be discussed.

The application of the collector following phenomenon of junction type semiconductors depends upon an adequate supply of minority carriers being injected into the transistor when saturated, and stored during cutoff. Transistor saturation is a condition in which both the emitter and collector junctions are forward biased. Considering an NPN saturated transistor, the emitter current being heavy, a high level injection of electrons takes place at the emitter-base junction. Since the base region is made physically narrower than the emitter or collector, the electrons flowing through the emitter base barrier will experience a low mortality rate, in that, very few of the total electrons will merge with the holes of the P type base material to form an electron-pair bond. The electrons not combining with the holes of the base will diffuse into the collector. The excess flow of electrons to the collector has a forward biasing effect on the collector-base junction causing a low net rate of flow of charge which at equilibrium equals the collector current, and is much less than the emitter current.

When the base potential of a saturated junction transistor is rapidly reduced to a level below that of the emitter, the emitter-base junction becomes reversed biased while the collector-base junction remains forward biased. The collector, if the collector resistance connected between the collector and a positive voltage source is somewhat large will follow the base voltage instead of immediately rising toward the positive external voltage or remain for a time unchanged, because the current necessary to change the collector-base junction potential appreciably is not available. The length of time that the collector potential remains essentially constant is called the delay time or storage time. Delay time results from a large number of minority carriers being stored in the base and collector region of the transistor at the moment when the input current is cutoff. If an NPN transistor is saturated and suddenly cutoff, the electrons would be the excess minority carriers in the base and holes the excess minority carriers in the collector. The carriers affecting storage time require a definite time to be collected which is a function of the degree of saturation. Therefore, the delay could be avoided by biasing the transistor so that it goes from cutoff into an active state rather than saturation. However, in the flip-flop arrangement of FIG. 1, the storage effect of carriers is utilized to bring about the desired result.

When the transistor is cutoff after being saturated, the excess charge in the base and collector is removed by recombination and collector-base current. Thus, the minority carrier storage effect consists of storing charge with a low impedance source, and removing it with a high impedance sink and recombination.

An approximate expression for the charge remaining during the period of collector-base forward bias is:

$$Q=Q_0e^{-t/\tau'}-\int_0^t i_c dt$$

where $Q_0$ is the total excess charge stored
$\tau'$ is the effective lifetime of minority carriers
$i_c$ is the collector current.

Since $i_c$ is, to a good approximation, constant during the period of forward bias, $$Q=Q_0e^{-t/\tau'}-It$$

Of interest is the time $\tau$ necessary to reduce this charge to 0 (zero), satisfying $$0=Q_0e^{-\tau/\tau'}-I\tau$$

Noting that the current I is given by $$I=\frac{E+V_u}{R}=\frac{V_o}{R}$$

where $E$=collector supply voltage
$V_u$=undershoot voltage, the following expression may be written relating delay time to collector resistance:

$$R=\frac{V_o}{Q_o}\tau_e{}^{\tau/\tau'}$$

Where $V_o$ is equal to the sum of the collector supply voltage and the undershoot voltage $V_u$ (maximum negative voltage at cutoff for an NPN transistor).

Recognizing that the slope of an exponential is proportional to its initial value, and that recombination will take place throughout the semiconductor, and superposition should not be applied in combining non-linear effects the following approximations are made to warrant the expression used above for charge remaining during collector forward bias.

(1) Recombination and charge recovery are independent processes.

(2) The ratio of the charge annihilated during recovery to that annihilated during decay is large.

(3) The various decay processes may be lumped into an effective minority-carrier lifetime.

These approximations can be justified on the basis of the following:

(1) It will be seen that this approximation is good for all $\tau$ whenever one effect is much greater than the other; thus, in particular, the expression is correct for either (or trivially, both) effects absent. In addition, the approximation is good for small $\tau/\tau'$ if the effects are of comparable magnitude.

(2) This approximation is reasonable under most conditions, but becomes especially good for low $\tau'$ and/or high extraction current.

(3) This approximation is usual.

Also the charge expression can be shown to be an approximation of that derived by Yohan Cho for a long-base diode in a paper titled, "A Method of Theoretical Analysis of High Speed Junction Diode Logic Circuits," appearing in the October 1963 "IEEE Transactions on Electronic Computers."

As the above equation indicates, a relationship exists between the collector resistance, R and the time $\tau$, necessary to reduce the charge stored in the transistor during saturation to zero. The equation was vertified by plotting a curve $\tau$ versus R with values of $\tau$ measured with a scope of the collector voltage waveform during cutoff immediately following saturation; then taking two points from the curve and using the R and $\tau$ values therefrom to provide two equations for $$R=\frac{V_o}{Q_o}\tau_e{}^{\tau/\tau'}$$

in order to solve for the constants $V_o/Q_o$ and $\tau'$; then calculating $\tau$ for given values of R to compare calculated $\tau$ with the measured $\tau$ of the $\tau$ versus R curve. It was found using transistors 2N1613, 2N1302, 2N706 and 2N2476 that the measured $\tau$ and calculated $\tau$ for each was substantially equivalent. Below are listed the values of constants $V_o/Q_o$ and $\tau$:

| | $V_o/Q_o$ (Ω/sec.) | $\tau'$ (μsec.) |
|---|---|---|
| 2N1613 | 1.51 | 2.63 |
| 2N1302 | 15.92 | 4.2 |
| 2N706 and 2N2476 | 78.0 | 27.3 |

Since $V_o$ is constant for all cases, it can be seen that the list is in order of decreasing $Q_o$, but increasing $\tau'$.

In the table below the R and $\tau$ relationship is indicated. Both $\tau$ measured and $\tau$ calculated are shown.

| R | 2N1613 | | 2N1302 | | 2N706 and 2N2476 | |
|---|---|---|---|---|---|---|
| | $\tau$ meas., μs. | $\tau$ cal., μs. | $\tau$ meas., μs. | $\tau$ cal., μs. | $\tau$ meas., μs. | $\tau$ cal., μs. |
| 47K | 4.9 | 4.9 | 1.8 | 1.9 | .6 | .6 |
| 82K | 5.7 | 5.8 | 2.5 | 2.7 | 1.0 | 1.1 |
| 120K | 6.5 | 6.5 | 3.2 | 3.4 | 1.5 | 1.6 |

The base and collector regions will have minority-carrier lifetimes which will differ because of differences in impurity concentrations and carrier type. Since the resistivity of the collector region is considerably greater than that of the base, the lifetime of minority carriers will, in general, be greater in the collector than in the base. It should be noted that each of the above types used was a planar, double-diffused epitaxial silicon transistor. The 2N1302 was an alloy-junction germanium transistor.

The upper limit on delay is set by the leakage current, which for high collector R, becomes an appreciable part of the collector current.

The delay time of a flip-flop is a factor which controls the allowable frequency range of the frequency source used to saturate and cutoff the transistor.

A quantitative discussion of the flip-flop of FIG. 1 will be given. Let the bias be set such that the conduction angle is $\theta$. Then the following inequality hold approximately:

$$R \geq \frac{R'}{f}(1-\theta/2\pi)e^{\frac{(1-\theta/2\pi)}{f\tau'}}$$

where $R$=collector resistance
$R'=V_o/Q_o$ Ω/sec.
$Q_o$=total charge stored
$\tau'$=effective minority carrier lifetime
$V_o=E+V_u$:
$E$=collector supply
$V_u$=the undershoot voltage
$f$=frequency of the sine wave It can be seen that R can be made quite small for large $f$.

The limiting value for $\theta$ is clearly $\pi$, for which $$R \geq \frac{R'}{2f}e^{1/2f\tau'} \approx \frac{R'}{2f} \text{ for large } f$$

$$(>1 \text{ mc.})$$

then $$f \geq \frac{R'}{2R}$$

is a lower bound of $f$.

This bound is optimistic in that the limit of $\theta=\pi$ can only obtain for 100% modulation, and pessimistic in that no circuit may still act as a flip-flop for $f$ less than the stated value, but the levels of the lowest one and highest zero potential will tend to approach each other.

The infimum on $f$ can be calculated by letting $\theta$ go to zero. Then $$f-\frac{R'}{R} \text{ holds.}$$

This is the most pessimistic limitation, yielding a value above which operation is guaranteed provided that bias point allows finite conduction.

The frequency of the sine wave source is not critical as long as it remains above the minimum value. Thus, an inexpensive oscillator without crystal control could be used.

The role of the sine wave is one of sustenance; the speed with which the flip-flop's state may be changed should be nearly independent of the sine wave frequency.

It might be mentioned in passing that all components in the flip-flop would yield to integrated circuit techniques.

It will be noted that in the down state or "0" state the average collector voltage never rises as high as ground; thus, other conventional switching circuits may be driven without "climb down" bleeders or diodes.

The fanout capability of one of these flip-flops is of interest. From the considerations discussed above, fanout current in the downstate is given by:

$$I_o=\frac{Q_o e^{-\tau/\tau'}}{\tau}-\frac{V_o}{R}$$

$I_{o\ max.}$ will obtain for $\tau_{min.}$ and $R_{max.}$; let $R\rightarrow\infty$, and $\tau=\tau_{min.}=\frac{1}{2}f$, then $$I_{o\ max.}=2Q_o fe^{-1/2f\tau'} \approx 2Q_o f$$

A more realistic condition would be that of symmetrical fanout, i.e. $I_o=V_o/R$. Then $$I_{o\ sym.} \approx Q_o f$$

Thus, fanout is proportional to excess stored charge and to sine-wave frequency.

Figure 2:
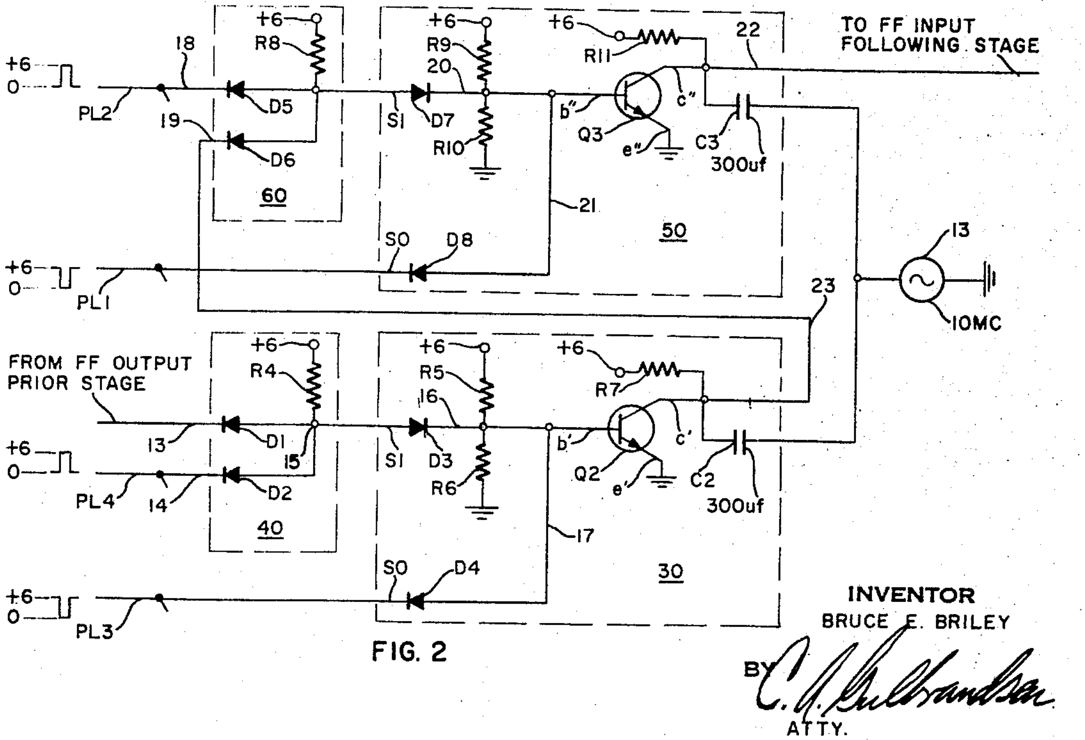
FIG. 2 is a schematic diagram of one stage of a shift register arrangement which employs the one transistor flip-flop of FIG. 1.

FIG. 2 shows a single stage of a shift register arrangement utilizing the one-transistor flip-flop of this invention. The single stage shown is essentially comprised of a pair of flip-flops 30, 50 and a pair of coincidence gates 40, 60. Transistor Q2, resistors R5, R6, R7, common sinusoidal signal source 13, and capacitor C2 comprises flip-flop 30. These components are interconnected in the same way as those in the flip-flop of FIG. 1; and flip-flop 30, therefore, functions in the manner described above. Transistor Q3, resistors R9, R10, R11, common sinusoidal signal source 13, and capacitor C3 comprise flip-flop 50. These components are also interconnected in the manner previously described so that the flip-flop 50 functions in the same manner as the flip-flop shown in FIG. 1.

Diodes D1, D2, D3, and resistor R4 comprise coincidence gate 40 associated with flip-flop 30; and diodes D5, D6, D7, and resistor R8 comprise coincidence gate 60 associated with flip-flop 50. In coincidence gate 40, diodes D1, D2, and D3 have their anodes connected in common at junction point 15. Resistor R4 connects that junction to the positive supply voltage. Input leads 13 and 14 are connected to the cathodes of diodes D1 and D2, respectively, and output lead 16 is connected to the cathode of diode D3 and to the base $b'$ of transistor Q2. The components of gate 60 are connected in a similar manner.

Whenever either, or both, of the diodes D1, D2 is unblocked by a ground potential on lead 13, 14, the junction point 15 is essentially at ground potential as well. Under these conditions the output lead 16 will have only the cutoff bias potential of base $b'$ of transistor Q2 on it. However, when both diodes D1 and D2 are blocked by potentials on leads 13 and 14 equal to the supply voltage, the junction point 15 is at a positive potential between ground and the supply voltage, and this potential will also be on output lead 16. Since the output lead 16 is connected to the base $b'$ of transistor Q2, the positive voltage signal on the output lead 16 will cause transistor Q2 to saturate. The operation of coincidence gate 60 is identical to this.

To complete the circuit of the shift register arrangement, the four pulse leads PL1, PL2, PL3, and PL4, and the interconnection of flip-flops and coincidence gates must be added. As has already been stated, output lead 16 from gate 40 is connected to the base $b'$ of transistor Q2 and output lead 20 from gate 60 is connected to the base $b''$ of transistor Q3. The output lead 23 from collector $c'$ of transistor Q2 is connected to the input lead 19 of gate 60. The output lead 22 from collector $c''$ of transistor Q3 is connected to an input lead of the appropriate flip-flop in the succeeding stage of the register arrangement. Pulse lead PL1 is connected to the base $b''$ of transistor Q3 by way of diode D8 and lead 21. Diode D8 is poled to isolate the base $b''$ from the positive voltage which normally exists on PL1 to bring transistor Q3 to its cutoff state. Pulse lead PL3 is similarly connected to the base $b'$ of transistor Q2 by way of diode D4 and lead 17, and the function of the connection is also similar.

Pulse lead PL2 is connected to input lead 18 of gate 60 and usually has a ground potential on it to keep diode D5 unblocked. A positive pulse on PL2 will block diode D5, and the output of gate 60 will then be determined by the signal on lead 19. Pulse lead PL4 is connected to input lead 14 of gate 40 and usually has a ground potential on it. Input lead 13 is connected to the output lead of the appropriate flip-flop in the preceding stage. When a positive pulse on PL4 blocks diode D2, the signal on the output lead of the flip-flop in the preceding stage determines the output of gate 40.

To facilitate a description of the operation of the shift register arrangement, the operating state of the flip-flop in which the transistor is cutoff will be called the "0" state; and the operating state in which the transistor is saturated will be called the "1" state.

The first step in the operation of the register arrangement is to reset the flip-flop 50 to "0." (It is, of course, to be assumed that other flip-flops in preceding and succeeding stages will be operated on at the same time.) This is accomplished by sending a pulse at ground potential on pulse lead PL1 to cause transistor Q3 to assume its cutoff state. The second step is to set flip-flop 50 in accordance with the state of flip-flop 30. This is accomplished by sending a pulse of positive potential on pulse lead PL2 since, if flip-flop 30 is in the "0" state, the positive potential on input lead 19 will coincide with the positive pulse, and the output of gate 60 will be a positive pulse to transistor Q3 which causes it to saturate; but if flip-flop 30 is in the "1" state, the potential on input lead 19 will be near ground and gate 60 will have no output to cause transistor Q3 to change its state. The third step is to reset the flip-flop 30 to "0" in the same manner that flip-flop 50 was reset to "0." The fourth step is to set flip-flop 30 in accordance with the state of the appropriate flip-flop in a preceding stage, and this is accomplished in the same manner that flip-flop 50 was set.

Figure 4:
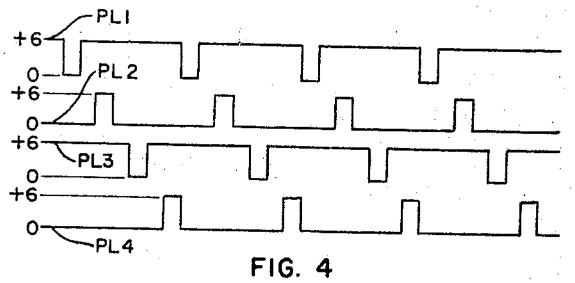
FIG. 4 is a chart showing the pulse sequence for the operation of the shift register of FIG. 3.
Figure 3:
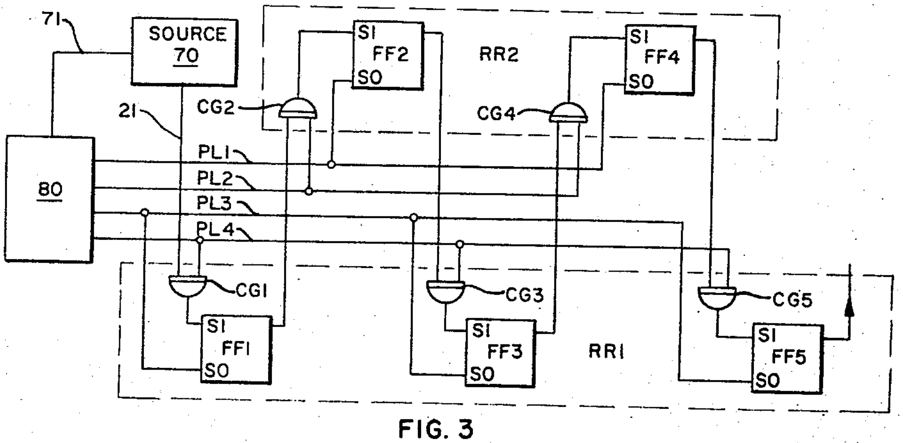
FIG. 3 is a block diagram of a shift register arrangement showing the interconnection of a number of stages of the type shown in FIG. 2.

It is apparent from this description of the operation of the register arrangement that the transfer of information from one flip-flop to another results in logical inversion. For this reason, the one-transistor flip-flop functions most efficiently in a double register configuration, as is shown in FIG. 3. In FIG. 3 flip-flops FF1, FF3, FF5, etc., are in the first register RR1 while flip-flops FF2, FF4, etc., are in the second register RR2. Also, coincidence gates CG1, CG3, CG5, etc., are associated with the flip-flops in the first register RR1 while coincidence gates CG2, CG4, etc., are associated with the flip-flops in the second register RR2. Each of the flip-flops shown in block diagram form are identical to the flip-flops of FIG. 2, as are the coincidence gates. Pulse distributor 80 sends the appropriate pulses over pulse leads PL1, PL2, PL3, and PL4 in the sequence shown in FIG. 4. Source 70 is a source of digital information which is controlled by the pulse distributor 80 over lead 71 and which sends information into the first register of shift register arrangement. The operation of the overall register arrangement is apparent from the above description of the operation of a single stage.

It is to be noted that the one transistor flip-flop which is disclosed in the co-pending application mentioned above could also be used in the shift register arrangement described above.

While the above description discloses specific embodiments of the invention, it is to be understood that numerous changes could be made without departing from the scope of the invention as claimed.

What is claimed is:

1. In a shift-register arrangement having a first and a second register, in combination:

a plurality of flip-flops in each of said registers, each of said flip-flops including:

an amplifying circuit including a single transistor with an input and an output electrode, and said circuit having a first operating state characterized by said transistor being cut off and by a first signal appearing on said output electrode and a second operating state characterized by said transistor being saturated and by a second signal appearing on said output electrode;

a D.C. voltage source connected to said input electrode and effective when said circuit is in said first state to maintain said circuit in said first state;

a source of sinusoidal voltage effectively coupled to said input electrode when said circuit is in said second state to maintain said circuit in said second state;

a first group of coincidence gates each having two input leads and a single output lead, said output lead being connected to said input electrode in a distinct one of said flip-flops in said first register, one of said input leads being connected to said output electrode in a distinct one of said flip-flops in said second register, each of said gates responding to the coincidence on its input leads of a first signal from a flip-flop in said second register and a first voltage pulse by sending a signal over said output lead to set said amplifying circuit in said flip-flop in said first register to said second operating state;

a second group of coincidence gates each having two input leads and a single output lead, said output lead being connected to said input electrode in a distinct one of said flip-flops in said second register, one of said input leads being connected to said output electrode in a distinct one of said flip-flops in said first register, each of said gates responding to the coincidence on its input leads of a first signal from a flip-flop in said first register and a second voltage pulse by sending a signal over said output lead to set said amplifying circuit in said flip-flop in said second register to said second operating state; and a common pulse source for supplying first, second, third and fourth voltage pulses on first, second, third, and fourth pulse leads respectively, said fourth pulse lead being connected to the other of said input leads of said of said gates in said first group, said second pulse lead being connected to the other of said input leads of each of said gates in said second group, said third pulse lead being connected to each of said input electrodes in each of said flip-flops in said first register, said first pulse lead being connected to each of said input electrodes in each of said flip-flops in said second register, said third and first voltage pulses having magnitudes such that they reset said amplifying circuits in said flip-flops in said first and second registers respectively to said first operating state, said pulses being repetitively supplied by said source in the order: first, second, third, fourth.

2. In a shift register arrangement having a first and a second register, in combination:

a plurality of flip-flops in each of said register, each of said flip-flops including:

an amplifying circuit including a singe transistor having a base, a collector, an emitter, and a collector-base junction and a resistive network connected to said collector, said circuit having a first operating state characterized by said transistor being cut off and said collector-base junction providing a high resistance so that a first signal appears on said collector, and having a second operating state characterized by said transistor being saturated and said collector-base junction providing a low resistance so that a second signal appears on said collector;

a D.C. network connected to said base to bias said transistor normally to cut-off; and a source of sinusoidal signals connected to said collector, said source being decoupled from said base by said collector-base junction when said transistor is cut off and being coupled to said base by said junction when said transistor is saturated, the amplitude and frequency being chosen in accordance with the parameters of said circuit so that they provide alternate injection and storage of minority carriers to maintain said transistor in a saturated state;

a first group of coincidence gates each having two input leads and a single output lead, said output lead being connected to said base of said transistor in a distinct one of said flip-flops in said first register, one of said input leads being connected to said collector of said transistor in a distinct one of said flip-flops in said second register, each of said gates responding to the coincidence on its input leads of a first signal from a flip-flop in said second register and a first voltage pulse by sending a signal over said output lead to set said amplifying circuit in said flip-flop in said first register to said second operating state;

a second group of coincidence gates each having two input leads and a single output lead, said output lead being connected to said base of said transistor in a distinct one of said flip-flops in said second register, one of said input leads being connected to said collector of said transistor in a distinct one of said flip-flops in said first register, each of said gates responding to the coincidence on its input leads of a first signal from a flip-flop in said first register and a second voltage pulse by sending a signal over said output lead to set said amplifying circuit in said flip-flop in said second register to said second operating state; and a common pulse source for supplying first, second, third, and fourth voltage pulses on first, second, third, and fourth pulse leads respectively, said fourth pulse lead being connected to the other one of said input leads of each of said gates in said first group, said second pulse lead being connected to the other of said input leads of each of said gates in said second group, said third pulse lead being connected to each of said bases of said transistors in each of said flip-flops in said first register, said first pulse lead being connected to each of said bases of said transistors in each of said flip-flops in said second register, said third and fourth voltage pulses having magnitudes such that they reset said amplifying circuit in said flip-flops in said first and second registers respectively to said first operating state, said pulses being repetitively supplied by said source in the order: first, second, third, fourth.

3. A shift register arrangement as claimed in claim 2, wherein said source of sinusoidal signals is common to all of said flip-flops.

4. A bistable flip-flop device comprising:

an amplifying circuit including a transistor having a base, emitter and collector, as well as emitter-base and collector-base junctions, said transistor being connected in grounded emitter configuration and having minority carrier storage capability;

signal input connections to said transistor for momentarily applying predetermined signals which initiate a change of state of said transistor from cutoff to conduction and vice versa;

first D.C. biasing means permanently connected to said collector;

a sinusoidal signal source in circuit connection with said collector;

said collector-base junction forming a gate between said sinusoidal signal source and said base, said first D.C. biasing means normally reverse biasing said gate so as to normally keep said gate open;

said gate being closed in response to the transistor assuming said conducting state upon said first momentary signal application, to effectively connect said sinusoidal signal source to said base, and said transistor thereupon being maintained in said conducting state due to the injection into said emitter-base junction of minority carriers in response to said connection of said sinusoidal signal source;

and second D.C. biasing means permanently connected to said base and effective in response to said transistor assuming said cutoff state upon said second-mentioned momentary signal application, to maintain said transistor in said cutoff state.

References Cited

UNITED STATES PATENTS

| | | | |
|---|---|---|---|
| 3,001,089 | 9/1961 | Tulp | 307—88.5 |
| 3,041,476 | 9/1962 | Parker | 307—88.5 |
| 3,070,779 | 12/1962 | Logue | 307—88.5 XR |
| 3,268,740 | 8/1966 | Rywak | 307—88.5 |

ARTHUR GAUSS, *Primary Examiner.*

J. ZAZWORSKY, *Assistant Examiner.*